(12) United States Patent
Bonekamp et al.

(10) Patent No.: US 8,829,634 B2
(45) Date of Patent: Sep. 9, 2014

(54) OPTOELECTRONIC DEVICE

(75) Inventors: Jeffrey E. Bonekamp, Midland, MI (US); Michelle L. Boven, Midland, MI (US); Ryan S. Gaston, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 1050 days.

(21) Appl. No.: 12/727,224

(22) Filed: Mar. 18, 2010

(65) Prior Publication Data

US 2010/0237453 A1    Sep. 23, 2010

Related U.S. Application Data

(60) Provisional application No. 61/162,398, filed on Mar. 23, 2009.

(51) Int. Cl.
*H01L 31/04*    (2014.01)
*H01L 31/048*    (2014.01)
*H01L 51/52*    (2006.01)

(52) U.S. Cl.
CPC ......... *H01L 51/5237* (2013.01); *H01L 51/5203* (2013.01); *H01L 31/048* (2013.01); *H01L 2251/5338* (2013.01); *Y02E 10/50* (2013.01)
USPC .................. 257/433; 257/432; 257/E31.032; 257/E31.052

(58) Field of Classification Search
CPC .... H01L 23/26; H01L 31/048; H01L 51/5259
USPC .................. 257/432, 433, E31.032, E31.052
See application file for complete search history.

(56) References Cited

U.S. PATENT DOCUMENTS 4,633,032 A    12/1986    Oido et al.
5,022,930 A    6/1991    Ackerman et al.
(Continued)

FOREIGN PATENT DOCUMENTS

EP    0720260 B1    2/2001
EP    1261037 A1    11/2002
(Continued)

OTHER PUBLICATIONS

Blanton; "Quantitative Analysis of Calcium Oxide Desiccant Conversion to Calcium Hydroxide Using X-Ray Diffraction"; Advances in X-ray Analysis; pp. 45-50; 2005; vol. 48; JCPDS—International Centre for Diffraction Data 2005.
(Continued)

*Primary Examiner* — Lynne Gurley
*Assistant Examiner* — Vernon P Webb

(57) ABSTRACT

The invention is an optoelectronic device comprising an active portion which converts light to electricity or converts electricity to light, the active portion having a front side for the transmittal of the light and a back side opposite from the front side, at least two electrical leads to the active portion to convey electricity to or from the active portion, an enclosure surrounding the active portion and through which the at least two electrical leads pass wherein the hermetically sealed enclosure comprises at the front side of the active portion a barrier material which allows for transmittal of light, one or more getter materials disposed so as to not impede the transmission of light to or from the active portion, and a contiguous gap pathway to the getter material which pathway is disposed between the active portion and the barrier material.

20 Claims, 2 Drawing Sheets

(56) References Cited

U.S. PATENT DOCUMENTS

| | | | |
|---|---|---|---|
| 5,048,925 A * | 9/1991 | Gerritsen et al. | 359/569 |
| 5,304,419 A | 4/1994 | Shores | |
| 5,322,161 A | 6/1994 | Shichman et al. | |
| 5,460,660 A | 10/1995 | Albright et al. | |
| 5,703,378 A | 12/1997 | Shepodd et al. | |
| 6,226,890 B1 | 5/2001 | Boroson et al. | |
| 6,465,953 B1 | 10/2002 | Duggal | |
| 6,537,688 B2 | 3/2003 | Silvernail et al. | |
| 6,673,436 B2 | 1/2004 | Kawaguchi et al. | |
| 6,673,997 B2 | 1/2004 | Blieske et al. | |
| 6,720,203 B2 | 4/2004 | Carcia et al. | |
| 6,740,145 B2 | 5/2004 | Boroson et al. | |
| 6,930,450 B2 | 8/2005 | Park et al. | |
| 6,977,391 B2 | 12/2005 | Frischknecht | |
| 7,018,713 B2 | 3/2006 | Padiyath et al. | |
| 7,074,501 B2 | 7/2006 | Czeremuszkin et al. | |
| 7,355,204 B2 | 4/2008 | Coe | |
| 7,365,442 B2 | 4/2008 | Pichler | |
| 2001/0015327 A1 | 8/2001 | Kitamura et al. | |
| 2002/0149096 A1 | 10/2002 | Liebeskind | |
| 2002/0170437 A1 | 11/2002 | DeGuiseppi et al. | |
| 2003/0037677 A1 | 2/2003 | Boroson et al. | |
| 2003/0117066 A1 | 6/2003 | Silvernail | |
| 2003/0143423 A1 | 7/2003 | McCormick et al. | |
| 2004/0012838 A1 * | 1/2004 | Huibers | 359/291 |
| 2004/0048037 A1 | 3/2004 | Klausmann et al. | |
| 2004/0051449 A1 | 3/2004 | Klausmann et al. | |
| 2004/0087043 A1 * | 5/2004 | Lee et al. | 438/6 |
| 2005/0023178 A1 | 2/2005 | Surattee et al. | |
| 2005/0045900 A1 | 3/2005 | Silvernail | |
| 2005/0062174 A1 | 3/2005 | Ingle | |
| 2005/0230691 A1 | 10/2005 | Amiotti et al. | |
| 2006/0000506 A1 | 1/2006 | Brabec et al. | |
| 2006/0083896 A1 | 4/2006 | McKinnell et al. | |
| 2006/0096632 A1 | 5/2006 | Oswald | |
| 2006/0100299 A1 | 5/2006 | Malik et al. | |
| 2006/0223903 A1 | 10/2006 | Cao et al. | |
| 2006/0278965 A1 | 12/2006 | Foust et al. | |
| 2006/0283546 A1 | 12/2006 | Tremel et al. | |
| 2006/0284556 A1 | 12/2006 | Tremel et al. | |
| 2007/0043136 A1 | 2/2007 | Cao et al. | |
| 2007/0172971 A1 | 7/2007 | Boroson | |
| 2007/0257611 A1 | 11/2007 | Hung et al. | |
| 2007/0262428 A1 | 11/2007 | Summers | |
| 2007/0295389 A1 | 12/2007 | Capps et al. | |
| 2008/0000195 A1 | 1/2008 | Clarahan | |
| 2009/0184090 A1 * | 7/2009 | Wuchse et al. | 216/13 |
| 2009/0288700 A1 * | 11/2009 | Lifka et al. | 136/251 |
| 2010/0132765 A1 | 6/2010 | Cumpston et al. | |

FOREIGN PATENT DOCUMENTS

| | | |
|---|---|---|
| EP | 1860471 A1 | 11/2007 |
| JP | 05235393 | 9/1993 |
| JP | 07169986 | 7/1995 |
| JP | 2005101404 | 9/2003 |
| JP | 2005174713 | 6/2005 |
| JP | 2007273267 | 10/2007 |
| WO | 2003080235 A1 | 10/2003 |
| WO | 2006050924 A1 | 5/2006 |
| WO | 2007094559 A1 | 8/2007 |
| WO | 2008132671 A2 | 11/2008 |
| WO | 2009147381 A2 | 12/2009 |
| WO | 2010111125 A1 | 9/2010 |

OTHER PUBLICATIONS

Jorgensen; "Stability/degradation of polymer solar cells"; Solar Energy Materials & Solar Cells; 2008; pp. 686-714; vol. 92; No. 7; Elsevier B.V.

Kempe; "Stress Induced Degradation Modes in CIGS Mini-Modules"; Solar Energy Materials & Solar Cells; 2008; pp. 2720-2738; vol. 90; No. 16; National Renewable Energy Laboratory.

* cited by examiner

OPTOELECTRONIC DEVICE

CROSS-REFERENCE TO RELATED APPLICATION

This application claims benefit of priority from U.S. Provisional Patent Application No. 61/162,398, filed Mar. 23, 2009, which application is incorporated by reference herein in its entirety.

This invention was made with U.S. Government support under contract DE-FC36-07G01754 awarded by the Department of Energy. The U.S. Government has certain rights to in this invention.

FIELD OF THE INVENTION

This invention relates to optoelectronic devices designed for resistance to materials that may degrade the performance of the active materials in the device.

BACKGROUND OF THE INVENTION

Optoelectronic devices are devices where an active material converts light energy into electricity or converts electricity into light energy. For certain optoelectronic devices the active material is highly sensitive to components found in the atmosphere.

For example, photovoltaic cells using copper indium diselenide (CIS) or copper indium gallium diselenide (CIGS) are known to be sensitive to moisture. Certain organic light emitting diodes are also known to have sensitivities to the atmosphere. Such devices are often enclosed to inhibit or prevent exposure to such atmosphere.

Multilayer optoelectronic devices typically have the active layers or portions formed directly on a transparent substrate, which is generally referred to as the front side. Many of these devices have been made using glass as the transparent substrate. Since glass has excellent barrier properties, and since many backside layers similarly have good barrier properties such as laminates comprised of metal foil, the concern has typically been about intrusion of water or oxygen at the interfaces or gaps at the sides of the packaging. To accommodate such potential leakage, it has been suggested to use getters (getters are also sometime referred to as scavengers and are substances that are added to a system to consume or inactivate traces of impurities or undesirable components) at the sides or behind the active layer. Also these devices sometimes have gaps or empty space at the sides or behind the active layer.

More recently there has been a move toward reducing the weight and increasing the flexibility of these devices. Thus, people have examined replacing glass with various transparent polymeric barrier substrates.

SUMMARY OF THE INVENTION

The inventors have discovered that the glass substitute materials provide insufficient protection against certain environmental components to maintain function.

Therefore, they have invented a structure that provides good durability of the to optoelectronic device while still allowing for use of barrier materials that while flexible may be less effective barriers than glass.

Specifically, the invention is an optoelectronic device comprising a) an active portion which converts light to electricity or converts electricity to light, the active portion having a front side for the transmittal of the light and a back side opposite from the front side, b) at least two electrical leads to the active portion to convey electricity to or from the active portion, c) an enclosure surrounding the active portion and through which the at least two electrical leads pass wherein the enclosure comprises at the front side of the active portion a barrier material which allows for transmittal of light, one or more getter materials disposed so as to not impede the transmission of light to or from the active portion, and a contiguous gap pathway to the getter material which pathway is disposed between the active portion and the barrier material and is defined by the front side of the active portion, an interior side of the barrier material and solid bridge elements providing a solid contact between the active portion and the barrier material.

DETAILED DESCRIPTION OF THE INVENTION

The optoelectronic device is preferably an organic light emitting diode or a photovoltaic device. The device may be an essentially flat or planar structure of reasonable to thickness or may be curved or curveable to conform to an underlying structure. The device is preferably flexible. In one embodiment, the device could also be sufficiently flexible to be wound for continuous roll-to-roll manufacturing for lower cost manufacturing without damage to the structure or any of its layers. Preferably, the device can be so wound on a core of about at least 1 meter diameter, more preferably a core of at least 0.5 meter diameter, and most preferably on a core of at least 0.3 meter diameter.

Figure 1:
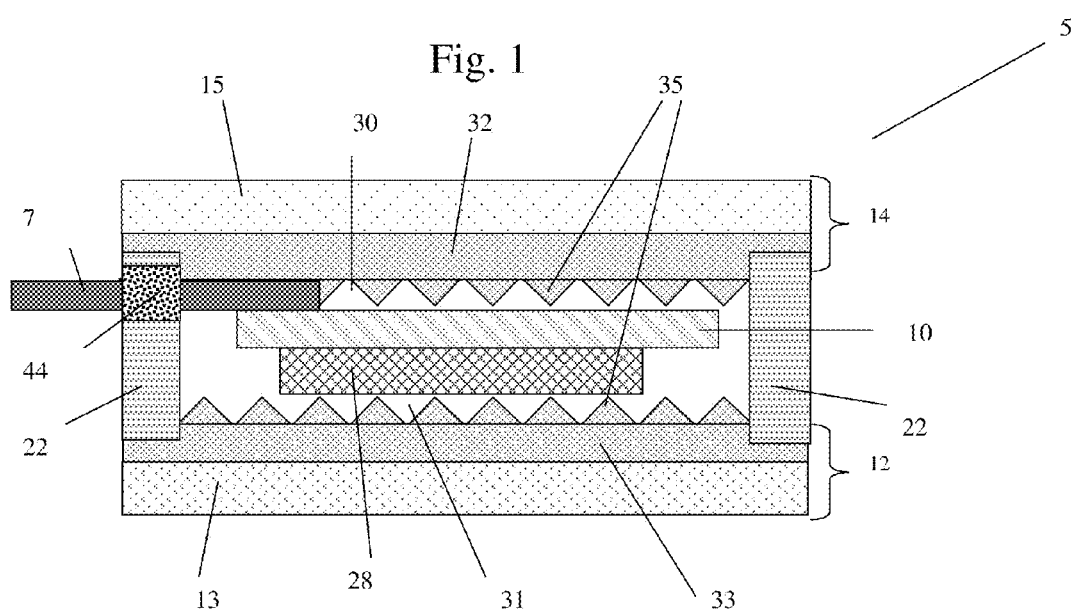
FIG. 1 is a cross section of one exemplary embodiment of the optoelectronic device of this invention.

Referring to FIG. 1 (which is not to scale), one example of one embodiment of an optoelectronic device 5 of the present invention is shown. The device comprises a backside material 12, an active portion 10, and a front side barrier 14. In this particular embodiment, a contiguous gap pathway 30 is disposed between both the front side barrier 14 and the active portion 10 and also an optional contiguous gap pathway 31 is disposed between the backside material 12 and the active layer 10. Bridge elements 35 create solid contact points between the front side barrier 14 and the active layer 10 preventing collapse of the layers and assuring that the contiguous gap pathways are maintained. On the backside, as shown in the embodiment in FIG. 1, the bridge elements 35 create solid contact points between a getter film 28 and the backside material 12. While the getter is shown as a film layer, the getter alternatively can be in particulate form located in the spaces of the contiguous gap pathway 31 at the backside and the bridge elements would then create contact points directly with the backside of the active layer. Furthermore, although not shown in FIG. 1, as another alternative or in addition to locating the getter at the backside of the active layer, the getter can be located at the sides of the active layer—e.g. between the seal 22 (which preferably forms a hermetic seal) and the active layer 10.

In the specific embodiment shown in FIG. 1, the contiguous gap pathways 30 and 31 are formed as shown by embossed films 32 and 33 where the bridge elements 35 are formed by raised portions of the embossed films. In this embodiment, the main portion of the frontside barrier is layer 15 while the main portion of the backside material is layer 13.

In other embodiments, the gap pattern is only on the front side of the active layer (i.e. between the active and the frontside barrier) and the getter is located on the sides or back provided in all instances a pathway to the getter is provided.

The contiguous gap pathway provides connectivity to the getter material of areas of the enclosure where barrier is insufficient, allowing permeation of undesirable components of the environment. This gap pathway enables relatively rapid movement to the getter(s) of undesirable molecules, which may permeate into the device, particularly through the front side barrier. Furthermore by having a gap pathway and/or gap pattern created by the bridge elements rather than a simple gap across the full structure, the device can maintain the gap while also maintaining flexibility in the device. As used herein "gap pattern" means a regular or random distribution of gaps that provides a gas flow passage or gap pathway. Gap pattern should not be construed as to require a regular repeating structure, but rather any structure of variation of raised and recessed areas whether regular or random is contemplated. For an OLED device, the gap pattern may advantageously be designed to correspond to pixels in the device so as to minimize distortion of any image the device is projecting.

The gap pattern can be provided by spacers positioned throughout the area between the barrier material and the active portion. More desirably, the gap pattern is provided by a three dimensional pattern integral to a film or coating. In that embodiment, the pattern may be directly on the inside of the barrier material (e.g., such as by an adhesive lamination process common in the art of film lamination such that there is a pattern on the side of the frontside barrier material adjacent to the active portion) or may be on a separate film layer disposed between the barrier and the active portion. Alternatively, the gap pattern may be applied directly on the active device, (including a coated active device or encapsulated active device) using methods such as photolithography and etching. In another method to provide gap pattern, coatings comprising spacers such as glass beads in a polymeric binder might also be applied by means such as direct gravure coating onto the inside of the barrier material, onto a separate film layer or onto the active device, coated active device or encapsulated active device. It is further possible that combinations of gap patterns may be used. It is most preferred to have the gap pattern, when provided by a film or coating directly applied to the inside of the barrier material, to serve as the seal material of the enclosure, thereby allowing enclosure seals about the perimeter of the active device to be made by such processes as impulse sealing.

According to one preferred example the gap pattern is on a film which forms a barrier bag enclosure in which the active portion and getter(s) are inserted and then sealed. This film and gap pattern would have a softening point or glass transition temperature above any subsequent lamination, or use temperatures for the device such that the gap pattern would be maintained throughout subsequent manufacturing processing and use of the device.

Light transmission of both front side barrier and gap pathway/gap pattern, whether provided by a laminated film or by separate films must be adequate for the device to function, and preferably is >50%, more preferably >80%, and most preferably greater than 90% transmission over the relevant wavelengths for that particular optoelectronic device. Preferably, the relevant wavelengths are matched to the wavelengths of emission or absorption for the particular optical devices. In one embodiment, particularly for chalcogenide based photovoltaic cells, the relevant wavelengths are on the order of 400-1100 nm, preferably 400-700 nm.

The contiguous gap pathway preferably has depth or gap space between the front side barrier and the active portion (and optionally the backside material and the active portion) of at least 1 micrometers and more preferably at least 5 micrometers. Many patterns (multiple in one), shapes, depths, frequency, combinations are contemplated. The gap portion can have a partial vacuum or may be filled with an inert gas such as nitrogen. In sealing the structure care should be taken to remove if possible undesirable materials from the enclosure such as to prolong the life of the device and getter material.

One convenient manner of forming a gap pattern is to use an embossed film. These films can be made of various materials such as polyethylene, polypropylene, etc and patterns can be made with different depths of emboss. For example, the emboss pattern could be a diamond, square, weave, floor plate, matte, leather grain, or linen type of patterns. It is preferable that the emboss pattern leave the maximum air gap possible while preventing collapse of the topside barrier onto the active portion. Surprisingly, applicants have found that a diamond or square pattern with ridge side down toward the active portion provides better management of water permeating through the frontside barrier than with ridge side up. This is surprising because ridge side down would not have been expected to form a contiguous gap pathway. Without wishing to be bound by theory, the inventors believe that ridge side down is better than ridge side up if there are sufficient gaps even on the ridges because ridge side down provides more space directly above the active portion which can then increase movement of the undesirable molecules that permeated into the enclosure to the getter.

FIG. 1 shows an embodiment of the invention where the seal material 22 connects the frontside barrier 14 and backside material 12. Alternatively, with proper selection, frontside 14 and backside 12 might be sealed (preferably hermetically) together instead by simply heat sealing, welding or laminating the frontside materials directly to the backside materials around the perimeter of the device. This works particularly well for examples where embossed films 30 and 32 are the same material.

FIG. 1 shows an electrical lead 7 having a surrounding metal lead sealant 44 through the side of the device 5 where the metal lead sealant 44 is in turn sealed (preferably hermetically) to seal material 22. Alternatively, an electrical lead could go through the backside film 12 with appropriate sealant applied to maintain the preferred hermeticity. Other layers or components, not shown, may also be used as is known in the art. For example, it may be desirable to apply an encapsulant or coating around the active layer. Such encapsulants or coatings may inhibit transport of water, for example, to the active portion or may prevent or minimize any corrosion of active portion.

The Active Portion

The active portion is an optoelectronic material or structure that converts light to electricity or electricity to light.

According to a first preferred embodiment the active portion is a thin-film solar cell. This thin film solar cell may be any such cell as is known in the art. The cell preferably will have a pn heterojunction comprising: a p-type semiconductor such as a thin multinary-compound semiconductor film, in particular, a I-III-VI.sub.2 Group chalcopyrite semiconductor, as a light absorption layer (e.g., IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula CuIn(1-x)GaxSe(2-y)Sy where x is 0 to 1 and y is 0 to 2. The copper indium selenides and copper indium gallium selenides are preferred.). Alternatively, any IB-III-VI.sub.2 group semiconductors could be used; examples include AgInS.sub.2, AgInSe.sub.2, AgGaSe.sub.2., AgGaTe.sub.2., AgInTe.sub.2., CuAlS.sub.2., etc.

The thin film solar cell further typically comprises a high-resistance buffer layer; and a n-type window layer (transparent conductive film) superposed over the light absorption layer through the buffer layer. The buffer layer can be formed from a material such as cadmium sulfide, zinc sulfide, indium sulfide, indium selenide, cadmium selenide, zinc selenide, zinc indium selenide, indium oxide and cadmium oxide. The transparent conductive film is typically a transparent conductive oxide. There is usually also a conductive material on the backside of the cell to serve as the backside electrical contact. This material may be selected from known conductive materials such as molybdenum, tungsten, tantalum, and niobium, but is preferably molybdenum.

Alternatively, the active portion could comprise use of various moisture or oxygen sensitive inorganic and organic based photovoltaic devices. Examples of moisture sensitive inorganic photovoltaic devices include heterojunction devices based upon CdTe. Examples of moisture and oxygen sensitive organic photovoltaic devices include planar, bulk, and ordered heterojunction devices based upon conjugated organic compounds such as poly(3.4-ethylene dioxythiophene) (PEDOT), poly(2-methoxy-5-(3',7'-dimethyloctyloxy)-1,4 phenylene vinylene) (MDMO-PPV), and (6,6)-phenyl $C_{61}$-butric acid methyl ester (PCBM).

According to a third preferred embodiment the optoelectronic device is an organic light emitting diode.

The active portion may be encapsulated to provide some protection against environmental conditions before assembly of the entire device and also some additional protection of the active layers after assembly. These encapsulation materials are transparent to the relevant wavelength of radiation for the relevant device. Examples of such materials include ethylvinyl acetate (EVA); transparent olefins, silicones or acrylates; polyvinyl butyrals, and ionomers such as Surlyn™ from DuPont.

The active portion preferably has an overall thickness of less than about 500, more preferably less than about 250, microns.

The Frontside Barrier Material

The frontside barrier material provides protection against elements in the atmosphere and allows for transmission of light to or from the active portion. The front side barrier may be glass. The frontside barrier is more preferably a flexible material. It may be a single layer or multilayer structure in form of a sheet or film.

A preferred frontside barrier is characterized in that less than 1 gram of water/square meter/day at 23° C./100% RH pass through the film as measured by ASTM F1249 or 1 cc of oxygen/square meter/day at 23° C./0% RH pass through the film as measured by ASTM D3985. More preferred frontside barrier is characterized in that less than 0.1 grams of water/square meter/day at 23 C/100% RH pass through the film as measured by ASTM F1249 or 0.1 cc of oxygen/square meter/day at 23 C/0% RH pass through the film as measured by ASTM D3985. Most preferred frontside barrier is characterized in that less than 0.1 grams of water/square meter/day at application temperature and humidity pass through the film as measured by ASTM F1249 or 0.1 cc of oxygen/square meter/day at application temperature and humidity pass through the film as measured by ASTM D3985.

According to one preferred embodiment the frontside barrier comprises an external weatherable film or coating on top of a film or sheet that provides good barrier to water vapor and oxygen. As noted previously the internal structure of the frontside barrier may itself bear an embossed pattern or be laminated to a film that has an embossed pattern where the emboss pattern is used to form the contiguous gap pathway.

The external film or coating, protects the frontside barrier against UV damage, scratch, mar, abrasion and undesirable contaminants that can reduce transmission efficiency. Among the useful materials for this portion of the frontside barrier are fluoropolymers such as ethylene-tetrafluoroethylene (ETFE), polyvinyldifluoride (PVDF), chlorotrifluoroethylene (CTFE) terpolymer of ethylene tetrafluoroethylene, hexafluoropropylene (EFEP), fluorinated ethylene-proplylene polymer (FEP), polyvinyl fluoride (PVF), and polytetrafluoroethylene (PTFE).

The film or sheet that has good barrier properties to water and/or oxygen may be used with or without the preferred external film or coating. Examples of preferred materials include multilayer films, particularly multilayer films of alternating inorganic and organic layers such as are taught in U.S. Pat. No. 7,018,713. Such exemplary films are available from Kureha (Cellel F2350), Fuji Film Corporation (transparent super high barrier film), Vitex (Barix™ encapsulation on flexible film and Flexible Glass Engineered Substrate).

The overall thickness of the frontside barrier is preferably at least 25 microns, more preferably at least 50 microns, and preferably less than about 800 microns, more preferably less than about 500 microns.

The Backside Material

The backside material provides protection against the elements. It need not be transparent or allow for transmission of light.

A preferred backside material is characterized in that less than 1 gram of water/square meter/day at 23 C/100% RH pass through the film as measured by ASTM F1249 or 1 cc of oxygen/square meter/day at 23 C/0% RH pass through the film as measured by ASTM D3985. More preferred backside barrier is characterized in that less than 0.1 grams of water/square meter/day at 23 C/100% RH pass through the film as measured by ASTM F1249 or 0.1 cc of oxygen/square meter/day at 23 C/0% RH pass through the film as measured by ASTM D3985. Most preferred backside barrier is characterized in that less than 0.1 grams of water/square meter/day at application temperature and humidity pass through the film as measured by ASTM F1249 or 0.1 cc of oxygen/square meter/day at application temperature and humidity pass through the film as measured by ASTM D3985.

The backside material may be a single layer or multilayer structure in form of a sheet or film. As noted above there can be a contiguous gap pathway between the backside material and the active portion and that gap pathway could be formed by spacers or by embossed film or pattern on or adhered to the backsheet. The backsheet can be glass, metal, polymeric film or sheet or a laminated film or sheet composite preferably comprising metal foil such as aluminum foil. The backside barrier is more preferably a flexible material. One preferred laminated barrier film composite for use as backsheet in photovoltaic devices, for example, is a four layer laminate structure of a fluoropolymer film such as TEDLAR polyvinylfluoride (PVF), aluminum foil, a film of biaxially oriented polyester (OPET), and a seal layer such as ethylene vinyl acetate (EVA). Commercially available backsheets are available from multiple suppliers, some examples of backsheet suppliers include Krempel, Honeywell, Kureha, Toppan Printing, BioSolar, Madico, and to Dai Nippon Printing. A common backsheet from Madico, Inc, is referred to as TAPE with the following construction: TEDLAR PVF, aluminum foil, OPET, ethylene vinyl acetate.

The overall thickness of the backside material is preferably at least 25 microns, more preferably at least 50 microns and preferably less than 800 microns, more preferably less than 500 microns.

The Getter Material

The term getter used here is a material which captures (e.g. chemisorbs, absorbs or adsorbs) components from the enclosed environment. When the getter captures water it is referred to here as a desiccant. Often getters are considered as reactive materials used for removing traces of gas from vacuum systems. According to one embodiment the material to be captured is oxygen, water vapor, CO, $CO_2$, $N_2$, $H_2$, acids, bases, other low Mw species harmful to operation or efficiency of an active device. Oxygen, for example, contributes to oxidation and photo-oxidation processes which can be involved in degradation of enclosure materials or devices.

The getter is positioned in the enclosure so as not to block the transmission of light. The getter may be at a side edge or edges of the device or be located at the backside of the active portion.

The getter system to be chosen should be selected to maintain the desired relative humidity (% RH) and oxygen level required for the electronic device used along with the lifetime desired. To be more specific it is desirable to be able to capture undesirable molecules at a rate sufficiently high such that the undesirable molecules are captured before damage occurs to the active portion. In addition, the speed of gettering required should also be matched or superior-to the competing rate of the active device. Reduced particle size or increased surface area often provides increased capture rates. Some getters inherently capture faster than others.

Depending on the sensitivity of the electronic device to moisture, more or less % RH, can be tolerated inside the enclosure. For electronic devices, such as amorphous silicon PV devices, able to handle higher % RH without degradation, physically adsorbing desiccant systems such as molecular sieves can be used successfully for long time periods. However, for more moisture sensitive devices such as CIGS, it is preferable to chemisorb the water to lower the % RH within the enclosure.

When oxygen is being captured a suitable getter might be $BaLi_4$ available as Combogetters from SAES. $BaLi_4$ also captures $N_2$, $CO_2$ and CO gases.

The presence of hydrogen gas can degrade the performance of some electronics products. Degradation caused by hydrogen in hermetically sealed packages containing gallium-arsenide (GaAs) discrete FETs with Pd or Pt as gate metals is a well known phenomenon: the noble metal of the gate turns the molecular $H_2$ into atomic $H_2$ that can diffuse inside the semiconductor material and cause a reduction in current and gain of the device. The use of a proper getter capable to selectively absorb hydrogen has proved to be the most effective way to prevent these degradation phenomena. SAES Rel-Hy hydrogen getter shows no particulation, selective sorption of hydrogen also in environments where other gases are present and no need for an activation process. Also, polymer hydrogen getters can be used and can be fabricated into a wide variety of forms. They can be produced as fine powders, pellets, complex shapes, adhesives, thin films, sprayable paints, high viscosity liquids, gels, etc. An example of a commercial polymeric $H_2$ getter is LTG-2 available from Vacuum Energies, Inc. (see U.S. Pat. No. 5,703,378). $CO_3O_4$ is also a hydrogen getter.

Among the suitable getters for moisture (dessicants) are molecular sieves/zeolites or chemisorbants. Chemisorbents, such as calcium oxide, involve an actual chemical bond and at low temperatures (<300° C.) can remove water from the environment down to ~0% RH. Materials of this type are alkali metal oxides, alkaline earth oxides (e.g., $Na_2O$, $K_2O$, CaO, BaO, MgO), sulfates, halides, perchlorates, hydrides of alkali and alkali earth metals (e.g., NaH, $LiAlH_4$), phosphorus pentoxide, and metals with higher ionization tendency than hydrogen (Li, K, NA, Ca, Ba, Al). Of course, mixtures of the above can be used as well. Also see for example descriptions in U.S. Pat. No. 6,740,145B2 for desiccants. One commercially available version is DryFlex, available from SAES Getters Inc., which was developed to be completely compatible with OLED requirements. It consists of calcium oxide captured in a matrix. This matrix is created onto a stainless steel substrate through a proprietary process that confers to DryFlex its unique porous structure, mechanical stability, flexibility and easy handling. DryFlex is stuck on an adhesive layer, for easy and reliable insertion into the device. Other products are commercially available, such as from SAES to Getters, Inc., such as a SAES dryer which is a mixture of zeolites, a single type or a mix of two different types, easily activated at 110° C. for >6 hours under vacuum or dry nitrogen giving a sorption capacity for water vapor that is about 16% of the mass of zeolites.

Nonevaporable getters (NEGs) which work at high temperature can be used as getters for gases. Generally, these consist of a film of a special alloy, often consisting primarily of zirconium. These alloy materials must form a passivation layer at room temperature which disappears when heated. Some examples of NEG's are available from SAES Getters, Inc. such as St2002, St172, St175 and St122. Each product has unique specificity for capturing one or more gas molecules.

It is desirable to include getters within the enclosure on the backside in a manner such that the material is essentially flat. Flat pouches possibly with quilt design in order to minimize lumping is preferred. Flat sheet or other thin film form of getter may also be used.

Electrical Leads

Electrical leads connect to the conductive back layer and transparent conductive film top layer of the active portion. The electrical leads go from the active portion through the enclosure either through the seal or through a via somewhere in the enclosure, preferably backside. Suitable sealants for lead-to-seal have the capability to bond hermetically both to the electrical lead and to the enclosure materials or seal. In one embodiment the sealant is a coating or sleeve on the electrical leads and where the sealant doesn't interfere with making electrical connections. Examples are EVA graft maleic anhydride to bond EVA seal to metal lead, HDPE graft maleic anhydride to bond HDPE seal to metal lead, or ethylene acrylic acid (EAA) to bond EAA seal to metal lead. The metal lead may need to have pretreatment to enhance the adhesion such as a flame or other appropriate treatment to enhance metal bonding. In another embodiment, it is possible to have multiple electrical leads through the enclosure.

Enclosure Seals

The seal materials are materials that join the topside barrier structure to the backside barrier structure to form a hermetic enclosure. Such materials could be epoxies such as used commonly in industry (see e.g. U.S. Pat. No. 6,720,203 B2). In one embodiment, the sealant can crosslink to a desired degree after the formation of the seal. In other embodiments, enclosure seal material is a heat seal layer adhered to both the topside and backside barrier structures such as copolymers of ethylene and vinyl acetate (EVA) such as ELVAX available from E.I. du Pont de Nemours and Company, LLDPE such as DOWLEX available from The Dow Chemical Company, LDPE, MDPE, HDPE all available from The Dow Chemical Company, EAA such as PRIMACOR available from The Dow Chemical Company, ionomers such as SURLYN available from E.I. du Pont de Nemours and Company, ethylene-propylene copolymers available from The Dow Chemical Company, substantially isotactic propylene/alpha-olefin copolymers sold under the trade name of VERSIFY and available from The Dow Chemical Company, or other suitable plastic commonly used as heat seal material to those knowledgeable in the art. In a further embodiment, the enclosure seal material is a heat seal layer adjacent to but also heat sealable to both the frontside and backside materials. It is preferable that the melt point is greater than and more preferably that the sealant material softening temperature is greater than the use temperature for the device. It is possible and preferable that if an embossed film is used to form the contiguous gap pathway that it also serves as a seal layer.

Assembly

A preferred embodiment of the device can be assembled as follows.

The active portion is preferably kept in dry atmosphere until ready for assembly. The electrical leads are encapsulated with sealant and welded onto the active portion. The active portion may be encapsulated or coated at this time with an encapsulant material. After cutting frontside and backside barriers to size, the frontside and backside films are heat sealed along the longest edge using a >9.5 micron wide seal. At least the frontside barrier preferably includes an emboss pattern or embossed film on the inside surface. The active device is placed against the seal with the active side faced toward the frontside film. The getter is placed at the side of or behind active device possibly with an optional thin material between to protect the active device from getter topography. The second edge of the enclosure is heat sealed. The third and long edge of the enclosure is made by heat sealing the leads where the applied lead sealant is located to affect an hermetic seal. The enclosure now containing the active device with two leads exiting the enclosure is now to placed in a vacuum sealer to remove air and moisture and any other undesirable elements adsorbed to surfaces of the device or enclosure. Once the desired vacuum and/or atmosphere is achieved in the chamber a heat seal is made at the final edge of the enclosure to create an hermetically sealed device and the vacuum in the vacuum chamber is then reduced to standard atmospheric pressure and the device removed.

EXAMPLES

Materials

Both frontside and backside barrier films used are High barrier film: RPP 37-1232 barrier film laminate with EVA sealant layer is available from Rollprint Packaging Products.

Gap pattern layer used is a polyethylene embossed film, having 100 diamonds per inch (dpi) emboss pattern with diamonds shaped blocks recessed into the film providing an emboss thickness of 89 micrometers and a nominal thickness of 75 micrometers. The emboss side is placed against the active portion.

Encapsulant Film: DNP PV-FSZ68, a silane grafted, α-olefin based film available from Dai Nippon Printing of Japan and was used as an encapsulant in this study. The thickness of the material is approximately 16 mils and the WVTR was measured to be ~2 g/m2/day at 38 degrees C./100% RH.

Getter: The chemisorb desiccant CaO used is Natrasorb Strip-Pax desiccants

Wire Leads: Flat wire leads (bussing wire) from Torpedo Specialty Wire. The wire dimensions are 0.015"×0.200". The wire material is soft tempered, Oxygen Free Copper (OFCU) that was coated/plated with 100% Tin at 13-20 micron thickness.

Sealants for Metal leads: A 4 mil monolayer cast film has 97 wt % Bynel 30E783 available from DuPont, 2 wt % CN4420 slip-antiblock masterbatch available from PolyOne Corporation., and 1 wt % 101830-U antiblock masterbatch available from Ampacet Corporation Photovoltaic Cell String: CIGS cell strings from Global Solar Energy described by Global Solar as a "12 cell sub-module". This sub-module consists of 12 CIGS cells "shingled" in to series to create the electrical properties shown in the following table.

TABLE

| GSE 12 cell CIGS array electrical parameters | | |
|---|---|---|
| Rated Power (Pmax) | Watts | 7.8 |
| Rated Voltage (Vmax) | Volts | 4.5 |
| Rated Current (Imax) | Amps | 1.7 |
| Efficiency | % | 9.7 |
| Open Circuit Voltage (Voc) | Volts | 6.5 |
| Short Circuit Current (Isc) | Amps | 2.1 |
| Temperature Coefficient for Power and Voltage | %/° C. | −0.50 |
| Aperture Area | $cm^2$ | 795 |

Test parameters are at STC: 1000 W/m2, 25° C. cell temperature, AM 1.5 spectrum. Power tolerance of finished module is −10%/+5% depending on style of processing, storage, and handling.

Construction of Devices for Testing

Preparation of Metal Leads

Leads 5 inch long are prepared by heat sealing a stack comprised of two cast film layers of sealant for metal leads of 1" wide (8 mil) over the metal lead over another two such film layers (8 mil) (5 leads are prepared in this manner at a time). The heat sealing is done on each side with top side heat/bottom side rubber configuration to allow good contact around the metal lead. Each side is sealed at 190° C. for 12 sec at 75% Powerstat setting and 40 psi using the Tempulse mode on a Vertrod model 30 LAB II heat sealer.

Resistance Welding

Wire leads already prepared with sealant were attached to the 12 Cell CIGS strings using a resistance welder. The two evenly spaced welds are made with CIGS cell string buss bars to 5 inch long leads placed ½ inch from top of CIGS and on the top (towards light) side of the CIGS cell string.

Lamination

For some experimental samples, a Spire Nisshinbo 1222S laminator was used to encapsulate (both sides) a few CIGS cell strings with a protective film—DNP Z-68. The lamination conditions used for generation of these samples are shown in the following table.

TABLE

Lamination conditions

| Platen Temp (° C.) | Vacuum (min) | Slow inflate pressure (kPa) | Slow inflate time (sec) | Medium inflate pressure (kPa) | Medium inflate time (sec) | Fast inflate pressure (kPa) | Fast inflate time (sec) | Hold time (min) |
|---|---|---|---|---|---|---|---|---|
| 150 | 3 | 7.8 | 22 | 31.4 | 19 | 61.0 | 5 | 7 |

Polycarbonate Support Sheet

The CIGS cell strings (7.5 inch×18 inch) with welded leads and possibly encapsulated, are attached to $1/8^{th}$ inch polycarbonate sheet (Lexan) using two strips of 3.5 mil×12.7 mm 3M Scotch 665 Double-Sided Permanent Tape applied along the 18 inch length at the top and bottom in order to minimize any mechanical damage to the CIGS cell strings during sample preparation, damp heat testing and PV efficiency/weight measurements.

Assembly of the Phtotovoltaic Device and Sealing of Enclosure

Seals for the enclosure are of three types. Bag inside dimensions are 9 inch×20 inch. Seals are all ½ inch wide, all at 40 psi, all with one side heat against a rubber bar and were all made on a Vertrod Model 30 LAB II in temperature control mode with a jaw opening set temperature of 35° C.

The first two seals ($1^{st}$ type, same type) are RPP 37-1232 EVA sealant to RPP 37-1232 EVA sealant and are made both on a 9 inch side and on a 20 inch side at 140° C. at 4 sec with 65% Powerstat. These two seals are made first and then the CIGS part (encapsulated or not and taped to polycarbonate sheet) is inserted with emboss film covering the part (emboss side to CIGS). Any CaO desiccant added is put onto the backside of the polycarbonate sheet prior to covering with the MDF7200 emboss film (emboss side to desiccant) which did not protrude into the seal involving the metal leads.

Next, a third seal ($2^{nd}$ type) is made on the 20 inch long side of enclosure with the leads protruding. The seal is made by positioning the seal bar at the sealant of the lead and through a stack of RPP 37-1232 EVA sealant to sealants for metal leads containing the metal leads to RPP 37-1232 EVA sealant thereby resulting in both leads to the PV device protruding through the seal. This seal is done at 140° C. for 4 sec at 65% Powerstat setting. After the seal is made the enclosure is flipped over and an identical seal is made on the opposite side to ensure adequate welding. It should be noted that the sealant on the leads now totals 16 mil and protruded with wings of ¼ inch on each side of the lead to allow more gradual transition of sealant in order to prevent channel leakers around the lead.

Finally, the last seal ($3^{rd}$ type) is made through a stack comprised of RPP37-1232 EVA sealant to MDF7200 to MDF7200 to RPP37-1232. This final seal to close the enclosure is made at 140° C. for 4 sec at 65% Powerstat setting. This seal is made after the enclosure is evacuated to 100 torr pressure for 2 minutes. Application of a vacuum to the enclosed CIGS results in the films firmly pressed against the CIGS.

Damp Heat Aging and Performance Measurement
Solar Simulation & Electrical Characterization A SPIRE 4600 Single Long Pulse (SLP) solar simulator is used to determine the electrical characteristics (IV curve, Fill Factor, Shunt Resistance, Series Resistance, and Efficiency) of the CIGS strings. The parameters used for testing are shown in Table 1. A typical standard error of measurement is approximately +/−2%.

TABLE 1

| Solar simulator parameters | |
|---|---|
| Intensity (Volts) | 5.766 |
| Lamp Voltage | 2250 |
| Load V (volts) | 6.300 |
| Cell Area (cm2) | 795 |
| Barrier area (m$^2$) | 0.2323 |

Heat Aging at 85 C/85% RH

A Blue M environmental chamber is used for damp heat testing of CIGS modules. The environmental chamber is set at 85° C. and 85% relative humidity (RH) per the IEC 61646 Thin-film Terrestrial Photovoltaic (PV) Module Design Qualification and Type Approval standard damp heat test. Temperature and humidity are maintained within approximately +/−5% of set value.

Samples are loaded vertically into a wood carrier with wood doweling separators to minimize consumed oven space but maximize and guarantee exposure for each sample. Samples surfaces are maintained with highest cleanliness and least surface damage during the measurement process by moving samples in and out of the carrier one at a time. Samples are allowed to cool after removing from oven prior to flashing and weighing Weighing is done on a Sartorius balance that provided accuracy of two decimal places.

Design of Experiment

Samples were prepared substantially as set out above with emboss film and without emboss film, with and without desiccant at various levels and with CIGS encapsulated and not encapsulated. Samples were assembled as per the procedures described above and exposed to light for 63 hours prior to measurement of efficiency. The samples were then immediately weighed and damp heat aging at 85 C/85% RH was begun. The samples are left in for various periods of time and then taken out to determine amount of water uptake in the cell and cell efficiency.

Figure 2:
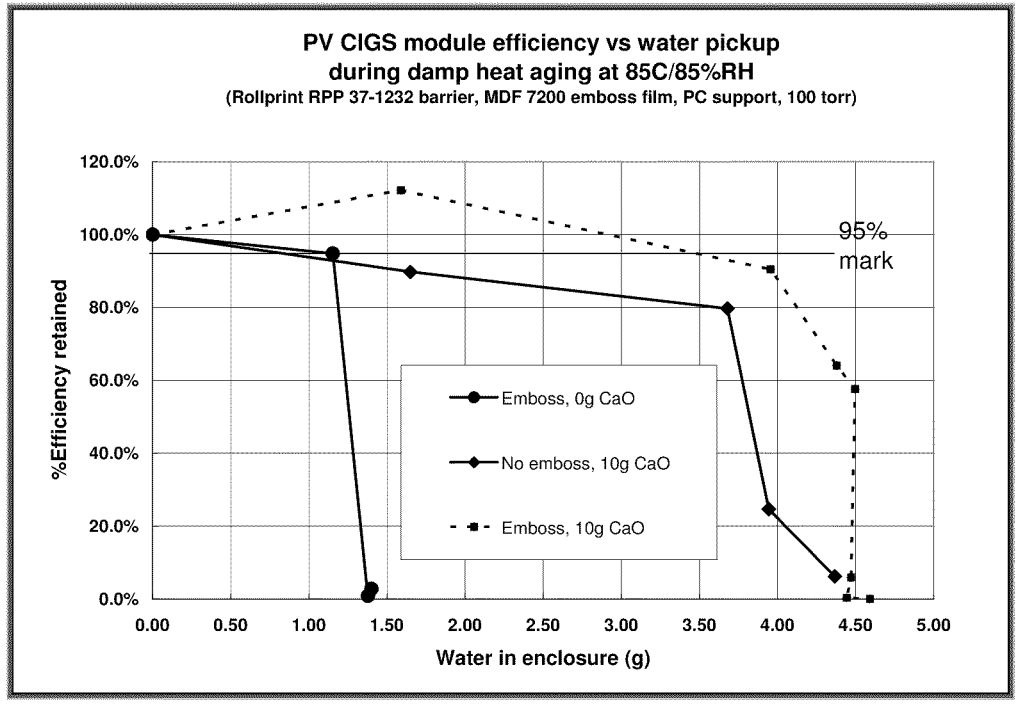
FIGS. 2 and 3 show photovoltaic cell efficiency versus water uptake for experimental optoelectronic devices.

FIG. 2 shows that cells having both embossed films on the front side and having getter can tolerate more water pick up and retain efficiency than cells without getter and cells without embossed films.

Figure 3:
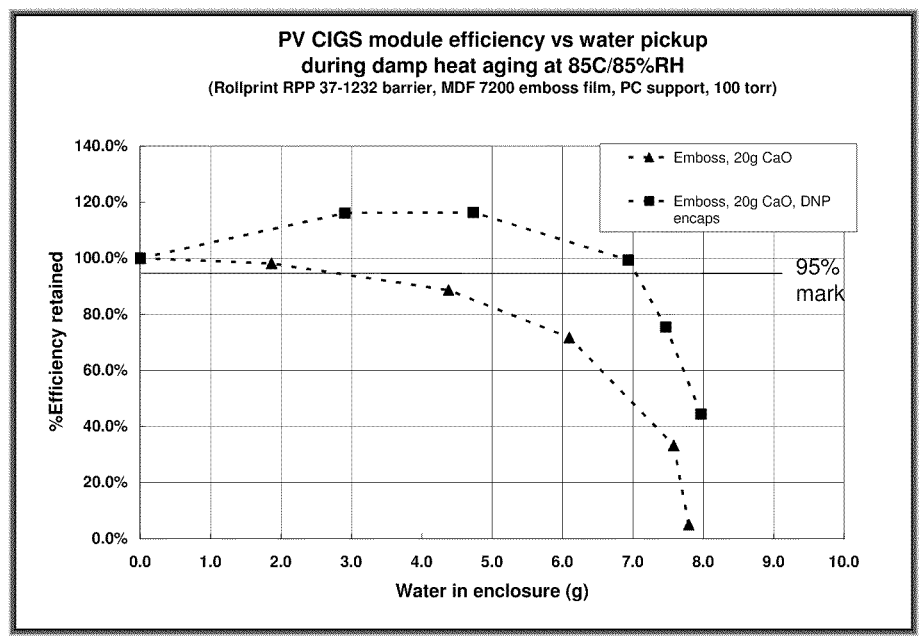

FIG. 3 shows that including an encapsulant around the cell string further enhances tolerance to water pick up.

What is claimed is:
1. An optoelectronic device comprising
   a) an active portion which converts light to electricity or converts electricity to light, the active portion having a front side for the transmittal of the light and a back side opposite from the front side,
   b) at least two electrical leads to the active portion to convey electricity to or from the active portion,
   c) an enclosure surrounding the active portion and through which the at least two electrical leads pass wherein the enclosure comprises
   at the front side of the active portion a barrier material which allows for transmittal of light a getter material disposed so as to not impede the transmission of light to or from the active portion, and a contiguous gap pathway to the getter material which pathway is disposed between the active portion and the barrier material wherein the contiguous gap pathway is defined by the front side of the active portion, an interior side of the barrier material and solid bridge elements providing a solid contact between the active portion and the barrier material.

2. The device of claim 1 wherein a contiguous gap pathway is also disposed between the backside of the active portion and a backside barrier material.

3. The device of claim 1 wherein the getter is disposed between the backside of the active portion and the backside barrier material.

4. The device claim 1 wherein the getter comprises an alkali metal oxide.

5. The device of claim 4 wherein the getter further comprises a molecular sieve.

6. The device of claim 3 wherein the getter composition is disposed as a flat sheet.

7. The device of claim 1 wherein the device is flexible.

8. The device of claim 1 where the active portion is moisture sensitive.

9. The device of claim 1 which is a photovoltaic device and the active portion comprises a backside electrical connector, a chalcogenide based absorber layer, a buffer layer and a transparent conductive layer.

10. The device of claim 1 wherein the bridge elements are provided by a film having an elevated pattern on it.

11. The device of claim 1 where the active portion is encapsulated.

12. The device of claim 10 where the film having an elevated pattern on it is laminated to backside and frontside barriers and where said film is heat sealed together hermetically.

13. The device of any claim 1 wherein the getter comprises a hydrogen getter, an oxygen getter or a moisture getter.

14. The device of any claim 1 where the electrical leads are hermetically sealed to sealant that hermetically seals to seal layers.

15. The device of claim 10 where the film with elevated pattern is embossed HDPE and the sealant to metal leads comprises HDPE-g-MAH.

16. The device of claim 1 where any of the layers from the active device out on the frontside have transparency greater than 70% from 380 nanometers to 1200 nanometers.

17. The device of claim 1 where the enclosure is at less than ambient pressure.

18. The device of claim 1 wherein the enclosure comprises an inert gas.

19. The device of claim 1 wherein the device is a photovoltaic device.

20. The device of claim 7 wherein the bridge elements are provided by a film having an elevated pattern on it.

* * * * *